United States Patent

Hirama

[11] Patent Number: 6,002,497
[45] Date of Patent: *Dec. 14, 1999

[54] THREE-LINE LINEAR SENSOR

[75] Inventor: Masahide Hirama, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/754,263

[22] Filed: Nov. 20, 1996

[30] Foreign Application Priority Data

Nov. 21, 1995 [JP] Japan .................................. 7-302437

[51] Int. Cl.$^6$ .............................. H04N 1/46; H04N 1/04; H04N 9/04; G03F 3/08
[52] U.S. Cl. ........................ 358/514; 358/515; 358/505; 358/512; 358/513; 358/518; 358/483; 358/514; 348/269
[58] Field of Search .................................... 358/514, 505, 358/512, 513, 515, 518, 446, 445, 483; 348/269

[56] References Cited

U.S. PATENT DOCUMENTS 5,398,061  3/1995  Miura et al. ............................ 348/269
5,430,977  7/1995  Kojima et al. .
5,475,508  12/1995  Maeshima et al. ...................... 358/514

FOREIGN PATENT DOCUMENTS

WO 92/06564  4/1992  WIPO .

OTHER PUBLICATIONS

Patent Abstracts of Japan, "Linear Sensor", Publication No. 05268410, Sato Maki, Oct. 15, 1993.

*Primary Examiner*—Edward L. Coles
*Assistant Examiner*—Twyler Lamb
*Attorney, Agent, or Firm*—Hill & Simpson

[57] ABSTRACT

In a three-line linear sensor, a first linear sensor (10) without electronic shutter structure and second and third linear sensors (20), (30) with electronic shutter structures (28), (38) being disposed in an axial symmetry fashion are combined and a line spacing (D1) between the first and second linear sensors (10), (20) can be reduced by an amount corresponding to the omitted electronic shutter structure. Also, since the second and third linear sensors (20), (30) are disposed in an axial symmetry fashion, a line spacing (D2) between the second and third linear sensors (20), (30) can be reduced and set to be substantially equal to the above-mentioned line spacing (D1).

14 Claims, 3 Drawing Sheets

THREE-LINE LINEAR SENSOR

BACKGROUND OF THE INVENTION

The present invention relates to a three-line linear sensor, and specifically to a three-line linear sensor with an electronic shutter.

Because as R, G, B three-line color linear sensors are able to produce color information of higher resolution as compared with a two-line color linear sensor comprising a line with pixels of R, B dot-sequentially arrayed thereon or line of only G, they are frequently used in digital copiers and scanners. However, in the three-line color linear sensor, R, G, B sensor arrays (pixel arrays) are spaced apart spatially so that signals simultaneously output from the respective sensor arrays become information that is spaced apart spatially. Therefore, a position correction memory is provided in the outside of the three-line color linear sensor to correct the position information. This position correction memory needs a large memory capacity because the amount of positions to be corrected increases as a distance between sensor centers of sensor arrays (hereinafter referred to as "line spacing") increases. Accordingly, in order to reduce the required memory capacity and to make the system inexpensive, it is necessary to set a narrow line spacing.

There are known three-line color linear sensors having an electronic shutter provided at every line for controlling a storage time during which signal charges are accumulated in each photoelectric-conversion portion of sensor array.

FIG. 1 of the accompanying drawings shows such a three-line color linear sensor with the referenced electronic shutters.

As shown in FIG. 1, the three-line color linear sensor with electronic shutters includes lines having read-out gates 113, 123, 133 for reading out signal charges from photoelectric-converting sections 111, 121, 131 of sensor arrays 112, 122, 132 and CCD (charge-coupled device) analog shift registers 114, 124, 134 for transferring signal charges thus read out. In addition, electronic shutter structures 117, 127, 137 composing shutter gates 115, 125, 135 and shutter drains 116, 126, 136 are added to all lines.

Because the line spacings d are increased by the electronic shutter structures 117, 127, 137, the three-line color linear sensor with electronic shutter structures unavoidably requires a memory having a very large storage capacity as an external position correction memory, which makes the system very expensive. Accordingly, particularly in three-line color linear sensors with electronic shutter structures, in order to reduce the memory capacity and to make the system inexpensive, it is very important to reduce the line spacings d.

SUMMARY OF THE INVENTION

In view of the aforesaid aspect, it is an object of the present invention to provide a three-line linear sensor with an electronic shutter structure in which the line spacing can be reduced.

According to the present invention, there is provided a three-line linear sensor which is comprised of a first linear sensor including a pixel array, a read-out gate and a charge transfer register each of which is disposed on one side of the pixel array, a second linear sensor including a pixel array, a read-out gate and a charge transfer register each of which is disposed on one side of the pixel array and an electronic shutter structure disposed on the other side of the pixel array, the second linear sensor being disposed with a predetermined line spacing between it and the first linear sensor while the charge transfer register is opposed to the first linear sensor, and a third linear sensor including a pixel array, a read-out gate and a charge transfer register each of which is disposed on one side of the pixel array and an electronic shutter structure disposed on the other side of the pixel array, the third linear sensor being disposed on the opposite side of the color linear sensor with a line spacing substantially equal to the predetermined line spacing between it and the second linear sensor in an axial symmetry fashion.

In accordance with another aspect of the present invention, there is provided a three-line linear sensor which is comprised of a first linear sensor including a pixel array, a read-out gate and a charge transfer register each of which is disposed on one side of the pixel array, a second linear sensor including a pixel array, a read-out gate and a charge transfer register each of which is disposed on one side of the pixel array, the charge transfer register being opposed to the first linear sensor, and a third linear sensor including a pixel array, a read-out gate and a charge transfer register each of which is disposed on one side of the pixel array, the third linear sensor being disposed on the opposite side of the first linear sensor in an axial symmetric fashion with respect to the second linear sensor.

In accordance with a further aspect of the present invention, there is provided a three-line linear sensor which is comprised of a first linear sensor including a pixel array, a read-out gate and a charge transfer register each of which is disposed on one side of the pixel array, a second linear sensor including a pixel array, a read-out gate and a charge transfer register each of which is disposed on one side of the pixel array and an electronic shutter structure disposed on the other side of the pixel array, the second linear sensor being disposed such that the charge transfer register is opposed to the first linear sensor, and a third linear sensor including a pixel array, a read-out gate and a charge transfer register each of which is disposed on one side of the pixel array and an electronic shutter structure being disposed on the other side of the pixel array, the third linear sensor being disposed on the opposite side of the first linear sensor with respect to the second linear sensor, in which the first linear sensor has the lowest sensitivity as compared with those of the second and third linear sensors and outputs of the first, second and third linear sensors are made substantially constant by adjusting storage times of the second and third linear sensors with the electronic shutter structure.

In the thus arranged three-line linear sensor, since the first linear sensor does not have an electronic shutter structure, the first linear sensor can be disposed with a reduced line spacing between it and the second linear sensor. On the other hand, since the third linear sensor is disposed in an axial symmetric fashion with respect to the second linear sensor, the read-out gate and the charge transfer register are not interposed between it and the second linear sensor so that the respective electronic shutter structures of the second and third linear sensors can be arranged in this resultant space satisfactorily and that the line spacing between it and the second linear sensor can be set freely. The line spacing between the second and third linear sensors can be set to be substantially equal to the line spacing between the first and second linear sensors.

DETAILED DESCRIPTION OF THE PREFERRED EMBODIMENT

A three-line color linear sensor according to the present invention will hereinafter be described in detail with reference to the drawings.

Figure 2:
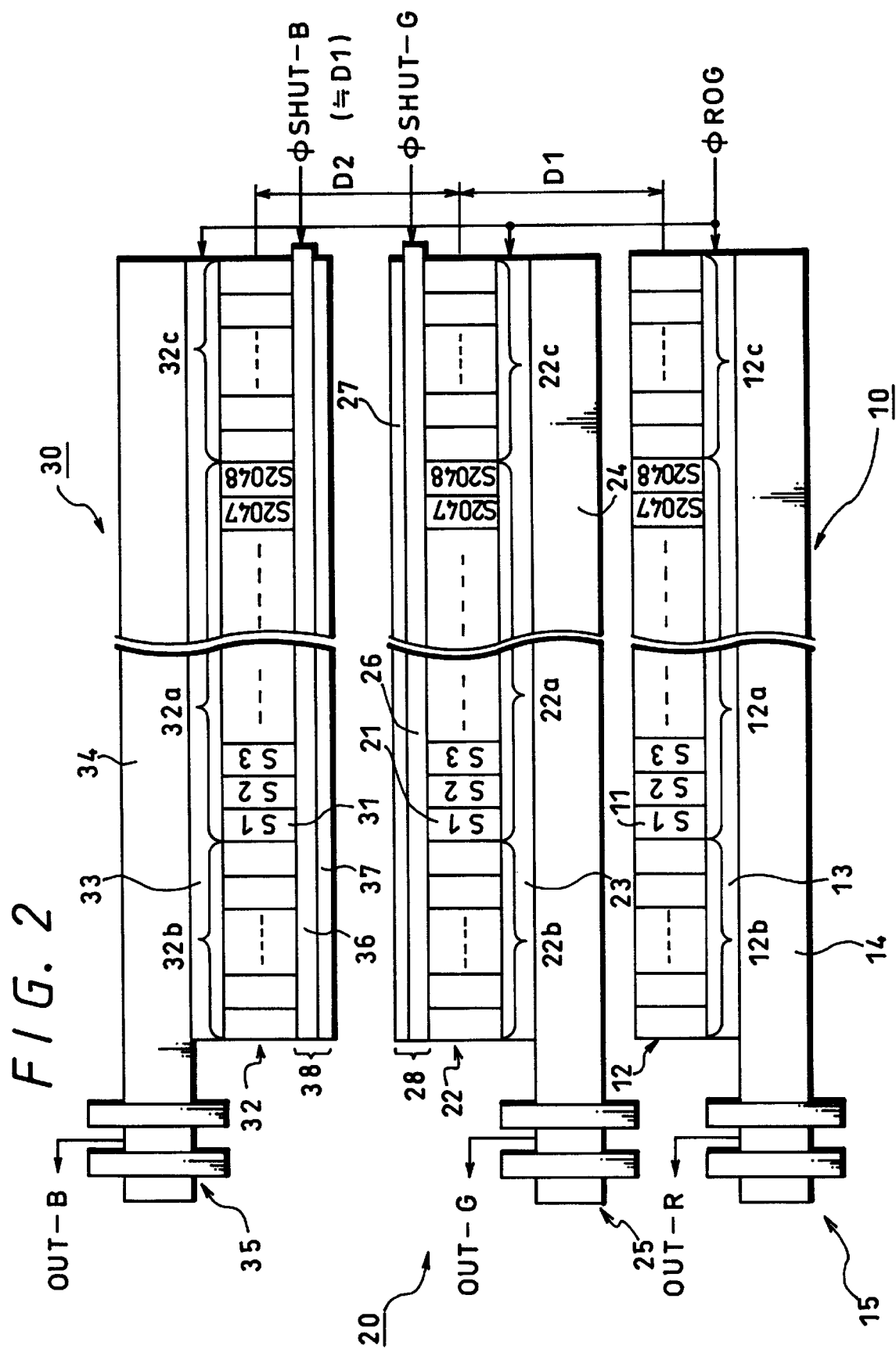
FIG. 2 is a diagram showing a three-line color linear sensor according to the present invention.

FIG. 2 is a diagram showing a three-line color linear sensor according to the present invention.

As shown in FIG. 2, the three-line color linear sensor according to the present invention includes first, second and third color linear sensors 10, 20, 30 corresponding to R (red), G (green), B (blue). The first color linear sensor 10 corresponding to R includes a pixel array (hereinafter referred to as "sensor array") 12 comprising a number of photoelectric-converting sections (pixels) 11 arranged in straight line, a read-out gate 13 for reading out signal charges photoelectrically-converted by each photoelectric-converting section 11 and a charge transfer register (hereinafter referred to as "CCD analog shift register") 14 for transferring signal charges thus read out.

The sensor array 12 comprises an effective pixel section 12a of 2048 pixels (S1 through S2048), for example, and ineffective pixel sections 12b, 12c of a plurality of pixels provided ahead of or behind the effective pixel section 12a. A color filter (not shown) corresponding to R is disposed on a light-receiving screen. The ineffective pixel sections 12b, 12c are so-called optical black (OPB) sections shielded at the light-receiving screen side of each photoelectric-converting section 11. The CCD analog shift register 14 has at its end portion of transfer side disposed a charge-to-voltage converting unit 15 of a floating diffusion amplifier configuration, for example.

In the first color linear sensor 10, signal charges at the respective photoelectric-converting sections 11 of the sensor array 12 are read out through the read-out gate 13 through the CCD analog shift register 14 in response to a read-out gate pulse φROG applied to the read-out gate 13. Then, the read-out signal charges are sequentially transferred by the CCD analog shift register 14, further converted by the charge-to-voltage converting unit 18 into a signal charge and thereby developed as an R signal output OUT-R.

A second color linear sensor 20 corresponding to G will be described. Similarly to the first color linear sensor 10, the second color linear sensor 20 comprises a sensor array 22 in which photoelectric-converting sections 21 are disposed linearly, a read-out gate 23 and a CCD analog shift register 24 each of which is disposed on one side of the sensor array 22. A color filter (not shown) corresponding to G is disposed on the light-receiving screen. In addition, the second color linear sensor 20 includes a horizontal electronic structure 28 comprising a shutter gate 26 and a shutter drain 27 disposed on the other side of the sensor array 22.

The second color linear sensor 20 is disposed in parallel to the first color linear sensor 10 with a predetermined line spacing D1 between it and the first color linear sensor 10 while the CCD analog shift register 24 is opposed to the first color linear sensor 10 side. The line spacing will be referred to hereinafter as "distance between the sensor centers of the sensor arrays 12, 22 of the two color linear sensors 10, 20".

In the thus arranged second color linear sensor 20, when the read-out gate pulse φROG is applied to the read-out gate 23, signal charges at the respective photoelectric-converting sections 21 of the sensor array 22 are read out through the read-out gate 23 to the CCD analog shift register 24, further sequentially transferred by the CCD analog shift register 24, converted into a signal voltage by the charge-to-voltage converting section 25 and then developed as a C signal output OUT-G. Moreover, when a G shutter pulse φSHUT-G is applied to the shutter gate 26, signal charges accumulated in the respective photoelectric-converting sections 21 of the sensor array are discharged through the shutter gate 26 to the shutter drain 27, whereby the electronic shutter structure 28 carries out the shutter operation to control the storage time of signal charges.

A third color linear sensor 30 corresponding to B will be described. As with the second color linear sensor 20, the third color linear sensor 30 comprises a sensor array 32 in which photoelectric-converting sections 31 are disposed linearly, a read-out gate 33 and a CCD analog shift register 34, each of which is disposed on one side of the sensor array 32 and an electronic shutter structure 38 composing a shutter gate 36 and a shutter drain 37, each of which is disposed on the other side of the sensor array 32. A color filter (not shown) corresponding to B is disposed on the light-receiving screen. The third color linear sensor 30 is disposed to be symmetrical with the second color linear sensor 20 with a line spacing D2 substantially equal to the above-mentioned line spacing D1 on the opposite side of the first color linear sensor 10.

In the thus arranged third color linear sensor 30, when the read-out gate pulse φROG is applied to the read-out gate 33, signal charges at the respective photoelectric-converting sections 31 of the sensor array 32 are read out through the read-out gate 33 to the CCD analog shift register 34, further sequentially transferred by the CCD analog shift register 34, converted into a signal voltage by the charge-to-voltage converting section 35 and thereby developed as a B signal output OUT-B. When a B shutter pulse φSHUT-G is applied to the shutter gate 36, the electronic shutter structure 38 carries out the shutter operation to control the time during which signal charges are stored in the respective photoelectric-converting sections 31 of the sensor array 32.

In the three-line color linear sensor of R, G, B, if sensitivities of R, G, B, for example, are 5V/(1x·s), 10V/(1x·s) and 15V/(1x·s), then when storage times of R, G, B are the same, a ratio of output voltages of R, G, B is given as 1:2:3. However, if the respective storage times of R, G, B are changed for every color, then output voltages can be set to be substantially constant. In this case, the output voltages of respective colors can be set to be substantially constant by adjusting storage times of two colors with higher sensitivities based on the storage time of color with the lowest sensitivity.

In the three-line color linear sensor according to the present invention, of R, G and B, an electronic shutter structure is removed from the color linear sensor 10 corresponding to R with the lowest sensitivity but the electronic shutter structures 28, 38 are added to the color linear sensors 20, 30 corresponding to G, B with sensitivities higher than that of the color linear sensor corresponding to R.

According to the above-mentioned arrangement, as compared with the structure (see FIG. 1) in which the electronic shutter structures are added to all lines, the line spacing D1 between the color linear sensor 10 corresponding to R and the color linear sensor 20 corresponding to G can be reduced by the amount corresponding to the omitted electronic shutter structure. As a consequence, it is possible to reduce the memory capacity of the position correction memory which is provided in the outside for correcting positions of each information of the three lines spaced apart spatially.

Study of the experimental results done by the same assignee of the present application shows that the line spacing D1 could be reduced by half. Thus, the memory capacity can be reduced by half.

Figure 3:
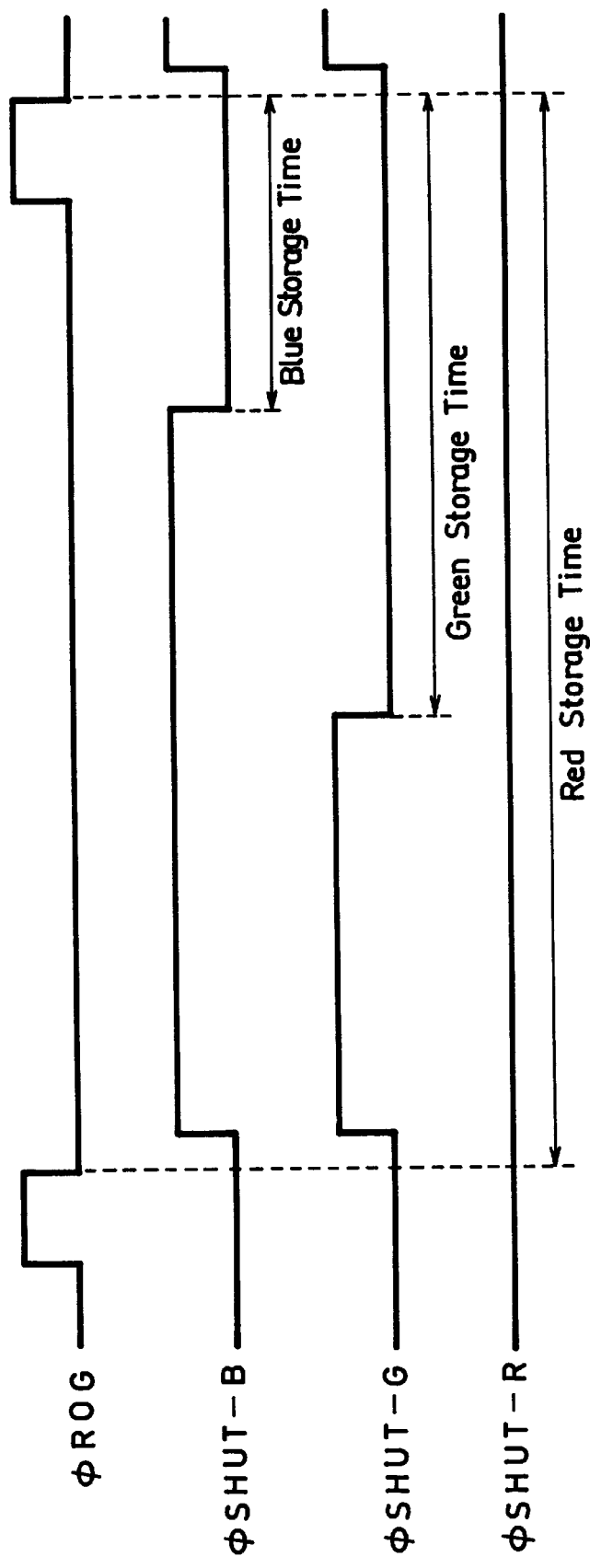
FIG. 3 is a timing chart used to explain operation of the three-line color linear sensor shown in FIG. 2.

The shutter pulses φSHUT-G and φSHUT-B are applied to the electronic shutter structures 28, 38 of the color linear sensors 20, 30 corresponding to G, B at timings shown by a timing chart of FIG. 3, whereby the storage time of the color linear sensor 10 corresponding to R with the lowest sensitivity is made longest, the storage time of the color linear sensor 20 corresponding to G with the sensitivity higher than that of the color linear sensor 10 corresponding to G is made shorter than that of the color linear sensor 10 corresponding to R and the storage time of the color linear sensor 30 corresponding to B with the highest sensitivity is made shortest.

As described above, the output voltages of respective colors can be made substantially constant by adjusting the storage times of the respective color linear sensors 20, 30 corresponding to G, B with the sensitivities higher than that of the color linear sensor 10 corresponding to R. Therefore, the respective output voltages of three lines obtained when the three-line color linear sensor takes a picture of white become substantially the same level, and hence a so-called white balance is established. Specifically, the respective storage times of the color linear sensors 20, 30 corresponding to G, B are adjusted by the electronic shutter structures 28, 38 such that the output voltages of respective colors become substantially constant, thereby establishing a white balance. Thus, a picture quality can be improved.

Figure 1:
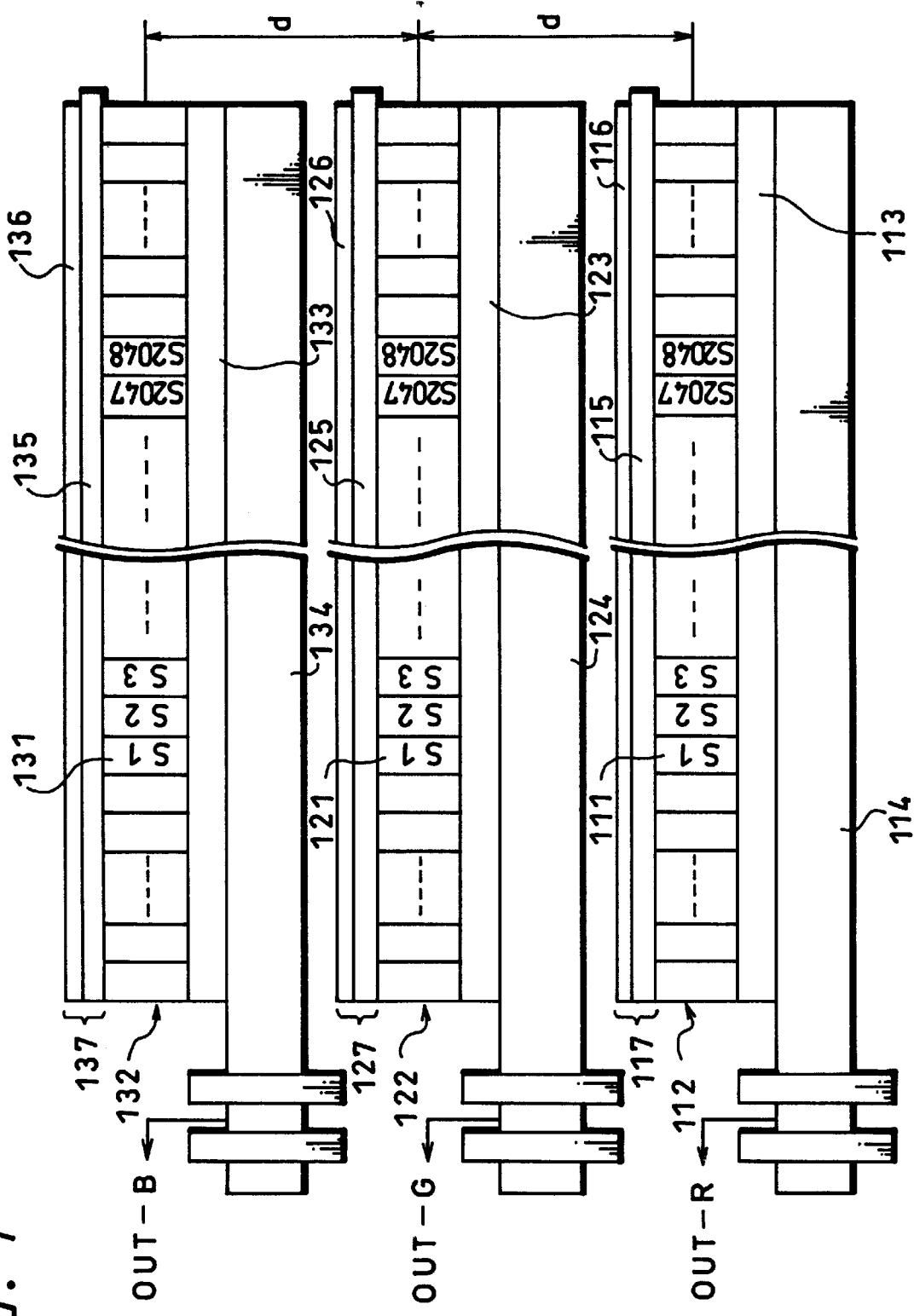
FIG. 1 is a diagram showing an example of a three-line color linear sensor with electronic shutter structure.

On the other hand, when the third color linear sensor 30 corresponding to B is disposed, if the third color linear sensor 30 is disposed in parallel to the second color linear sensor 20, then the shutter structure is interposed between the second and third color linear sensors 20 and 30 as will be clear from the structure shown in FIG. 1. As a result, the line spacing D2 between the second and third color linear sensors 20 and 30 cannot be reduced to the line spacing D1 between the first and second color linear sensors 10 and 20. Therefore, the line spacings D1, D2 among the three lines become unequal.

If the line spacings D1, D2 among the three lines are unequal, then when the three-line color linear sensor is applied to a color copier or when a color image is reproduced in a special reproduction mode such as reduction or expansion, there occurs a problem of color shift. For example, if the line spacing D1 between the color linear sensor 10 corresponding to R and the color linear sensor 20 corresponding to G corresponds to 4 lines, the line spacing D2 between the color linear sensor 20 corresponding to G and the color linear sensor 30 corresponding to B corresponds to 5 lines and a color image is reduced by 50%, then a resolution of reduced color image becomes the half of the maximum resolution. Therefore, in the position correction memory, data obtained after two lines corresponds to data of G for line data of R and data obtained after 2.5 lines corresponds to data of B.

In this case, data obtained after 2 lines may be used as the data of G satisfactorily. However, since data obtained after 2.5 lines does not exist for the data of B, data obtained after 2.5 lines should be obtained by averaging data of 2.5 lines after and data of 3 line after, which process unavoidably causes a problem of color shift. If the reduction ratio/expansion ratio becomes an odd sum such as 33%, then the color shift becomes more remarkable. From the above-mentioned reasons, the line spacings D1, D2 among the three lines should preferably be made equal.

In the three-line color linear sensor according to the present invention, the third color linear sensor corresponding to B is disposed with respect to the second color linear sensor 20 in an axial symmetry fashion. As a result, since the CCD analog shift register 34 with a wide width is not interposed between the third color linear sensor 30 and the second color linear sensor 20, the line spacing D2 between the second and third color linear sensors 20, 30 can be reduced and also set to be substantially equal to the line spacing D1 between the first and second color linear sensors 10 and 20.

Specifically, the line spacing between the second and third color linear sensors 20 and 30 can be reduced as compared with the aforesaid arrangement (see FIG. 1). In addition, since a large enough space is maintained between the third and second color linear sensors 30 and 20, the electronic shutter structures 28, 38 of the second and third color linear sensors 20, 30 can be arranged with a space large enough.

As described above, according to the present invention, in the three-line linear sensor, since the first color linear sensor without electronic shutter is disposed with respect to the second and third linear sensor with the electronic shutter structures in an axially symmetric fashion, the line spacing between the first and second color linear sensors can be reduced by the amount corresponding to the omitted electronic shutter structure and also the line spacing between the second and third color linear sensors can be reduced and can be made substantially equal to the above-mentioned line spacing by the axis symmetry. Therefore, the memory capacity of the external position correcting memory can be reduced.

While the present invention is applied to the three-line color linear sensor as described above, the principle of the present invention may be applied to a black-and-white three-line linear sensor in which R, G, B light is separated by a prism and introduced into three sensors.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A three-line linear sensor comprising:
   a first linear sensor having a pixel array, a read-out gate and a charge transfer register each of which is disposed on one side of said pixel array without a corresponding electronic shutter connected to the pixel array of the first linear sensor;
   a second linear sensor including a pixel array, a read-out gate and a charge transfer register each of which is disposed on a first side of said pixel array of said second linear sensor and an electronic shutter structure disposed on a second side of said pixel array, said second linear sensor being disposed with a predetermined line spacing from said first linear sensor with said charge transfer register side adjacent said first linear sensor; and
   a third linear sensor including a pixel array, a read-out gate and a charge transfer register each of which is disposed on a first side of said pixel array of said third linear sensor and an electronic shutter structure disposed on a second side of said pixel array, said third linear sensor being disposed on the side of said second linear sensor that is opposite the first linear sensor with a line spacing from said second linear sensor substantially equal to said predetermined line spacing in an axial symmetry fashion.

2. A three-line linear sensor as claimed in claim 1, in which said first linear sensor has a lowest sensitivity as compared with sensitivities of said second and third linear sensors.

3. A three-line linear sensor as claimed in claim 1, in which said electronic shutter structure is a horizontal electronic shutter structure comprising a shutter gate and a shutter drain.

4. A three-line linear sensor as claimed in claim 1, in which outputs of said first, second and third linear sensors are made substantially constant by adjusting respective storage times of said second and third linear sensors with said electronic shutter structures.

5. A three-line linear sensor as claimed in claim 1, in which the first linear sensor has a shorter charge storage time than said third linear sensor.

6. A three-line linear sensor comprising:
   a first linear sensor including a pixel array, a read-out gate and a charge transfer register each of which is disposed on a first side of said pixel array;
   a second linear sensor including a pixel array, a read-out gate and a charge transfer register each of which is disposed on a first side of said second pixel array, said charge transfer register of said second linear sensor located at a second side of said pixel array of said first linear sensor; and
   a third linear sensor including a pixel array, a read-out gate and a charge transfer register each of which is disposed on a first side of said third pixel array, said third linear sensor being disposed on the second side of said second linear sensor in an axial symmetric fashion with respect to said second linear sensor.

7. A three-line linear sensor as claimed in claim 6, in which said second linear sensor is disposed with a predetermined line spacing from said first linear sensor and said third linear sensor is disposed with a line spacing substantially equal to said predetermined line spacing from said second linear sensor.

8. A three-line linear sensor as claimed in claim 6, in which both or either of said second and third linear sensors has an electronic shutter structure disposed on a second side of said pixel array.

9. A three-line linear sensor as claimed in claim 8, in which said first linear sensor has the lowest sensitivity as compared with sensitivities of said second and third linear sensors.

10. A three-line linear sensor as claimed in claim 8, in which outputs of said first, second and third linear sensors are made substantially constant by adjusting storage times of said second and third linear sensors with said electronic shutter structure.

11. A three-line linear sensor comprising:
    a first linear sensor including a pixel array, a read-out gate and a charge transfer register each of which is disposed on a first side of said pixel array;
    a second linear sensor including a pixel array, a read-out gate and a charge transfer register each of which is disposed on a first side of said pixel array of said second linear sensor and an electronic shutter structure disposed on a second side of said pixel array of said second linear sensor, said second linear sensor being disposed such that said charge transfer register is adjacent to said first linear sensor; and
    a third linear sensor including a pixel array, a read-out gate and a charge transfer register each of which is disposed on a first side of said pixel array of said third linear sensor and an electronic shutter structure being disposed on the second side of said pixel array of said third linear sensor, said third linear sensor being disposed with its charge transfer section adjacent said second linear sensor, in which said first linear sensor has a lowest sensitivity as compared with sensitivities of said second and third linear sensors and outputs of said first, second and third linear sensors are made substantially constant by adjusting storage times of said second and third linear sensors with said electronic shutter structures.

12. A three-line linear sensor as claimed in claim 11, in which said third linear sensor is disposed on the opposite side of said first linear sensor in an axial symmetric fashion with respect to said second linear sensor.

13. A three-line linear sensor as claimed in claim 11, in which said second linear sensor is disposed with a predetermined line spacing between it and said first linear sensor and said third linear sensor is disposed on the opposite side of said first linear sensor with a line spacing equal to said predetermined line spacing in an axial symmetry fashion with respect to said second linear sensor.

14. A three-line linear sensor as claimed in claim 11, in which either of said second and third linear sensors having a higher sensitivity is given a shorter charge storage time by said electronic shutter structure.

* * * * *